United States Patent
Grandstrom et al.

(10) Patent No.: US 11,060,051 B2
(45) Date of Patent: Jul. 13, 2021

(54) COMPOSITION FOR RINSING OR CLEANING A SURFACE WITH CERIA PARTICLES ADHERED

(71) Applicant: FUJIMI INCORPORATED, Aichi (JP)

(72) Inventors: Jimmy Erik Grandstrom, Tualatin, OR (US); Hisashi Takeda, Tualatin, OR (US)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/595,594

(22) Filed: Oct. 8, 2019

(65) Prior Publication Data

US 2020/0115661 A1    Apr. 16, 2020

Related U.S. Application Data

(60) Provisional application No. 62/745,027, filed on Oct. 12, 2018.

(51) Int. Cl.
| | |
|---|---|
| *C11D 7/32* | (2006.01) |
| *C11D 11/00* | (2006.01) |
| *C11D 1/06* | (2006.01) |
| *C11D 3/30* | (2006.01) |
| *C11D 3/04* | (2006.01) |
| *C11D 3/34* | (2006.01) |
| *B08B 1/00* | (2006.01) |
| *C11D 3/36* | (2006.01) |
| *H01L 21/02* | (2006.01) |
| *B08B 3/08* | (2006.01) |
| *C11D 3/20* | (2006.01) |

(52) U.S. Cl.
CPC .......... *C11D 11/0047* (2013.01); *B08B 1/001* (2013.01); *B08B 3/08* (2013.01); *C11D 1/06* (2013.01); *C11D 3/044* (2013.01); *C11D 3/2082* (2013.01); *C11D 3/30* (2013.01); *C11D 3/349* (2013.01); *C11D 3/361* (2013.01); *C11D 3/365* (2013.01); *H01L 21/02065* (2013.01)

(58) Field of Classification Search
CPC .................................................. C11D 11/0047
USPC ......................................................... 510/175
See application file for complete search history.

(56) References Cited

U.S. PATENT DOCUMENTS

| | | |
|---|---|---|
| 5,968,280 A | 10/1999 | Ronay |
| 6,440,856 B1 | 8/2002 | Bessho et al. |
| 6,546,939 B1 | 4/2003 | Small |
| 8,900,371 B2 * | 12/2014 | Mizuta ............ H01L 21/02052 134/1.2 |
| 2005/0176606 A1 | 8/2005 | Konno et al. |
| 2006/0270573 A1 | 11/2006 | Ikemoto et al. |
| 2008/0045016 A1 | 2/2008 | Andou et al. |
| 2009/0133716 A1 * | 5/2009 | Lee ................ H01L 21/02063 134/3 |
| 2013/0053291 A1 | 2/2013 | Otake et al. |
| 2014/0128307 A1 | 5/2014 | Chhabra et al. |
| 2015/0140820 A1 | 5/2015 | Kawada et al. |
| 2016/0013072 A1 | 1/2016 | Sera |
| 2016/0122696 A1 | 5/2016 | Liu et al. |
| 2018/0037852 A1 | 2/2018 | Thomas et al. |
| 2019/0300821 A1 * | 10/2019 | Yoshizaki ............ C11D 3/3776 |
| 2019/0390139 A1 * | 12/2019 | Tamboli ............ C11D 17/0008 |
| 2020/0095467 A1 * | 3/2020 | Yoshino ................ C09K 13/00 |
| 2020/0095468 A1 * | 3/2020 | Yamazaki ................ C09G 1/02 |

FOREIGN PATENT DOCUMENTS

| | | |
|---|---|---|
| JP | 2003-313584 A1 | 11/2003 |
| JP | 2005-060660 A | 3/2005 |
| JP | 2005-194294 A | 7/2005 |
| JP | 2013-008751 A | 1/2013 |
| JP | 2017-011225 A | 1/2017 |

* cited by examiner

*Primary Examiner* — Gregory E Webb
(74) *Attorney, Agent, or Firm* — Foley & Lardner LLP

(57) ABSTRACT

To provide a composition for rinsing or cleaning a surface to which ceria particles are attached and a surface treatment method for removing ceria particles from the surface using the same.

The composition according to the present invention contains an anionic surfactant, an organic amine compound, and a protic organic acid molecule and has a pH of less than 6.

9 Claims, No Drawings

COMPOSITION FOR RINSING OR CLEANING A SURFACE WITH CERIA PARTICLES ADHERED

CROSS-REFERENCE TO RELATED APPLICATION

This application is based upon and claims the benefit of priority of U.S. Provisional Application No. 62/745,027 filed on Oct. 12, 2018, the entire contents of which are incorporated herein by reference.

BACKGROUND

1. Technical Field

The present invention relates to a composition for rinsing or cleaning a surface to which ceria particles are attached (surface having ceria particles) and a method for removing ceria particles from the surface using the same.

2. Description of Related Arts

One of the major challenges of CMP for enabling novel semiconductor device fabrication nodes is the shallow trench isolation (STI) process. STI requires a high $SiO_2$ removal rate, high $SiO_2:Si_3N_4$ selectivity, less defects and preferably low cost. In STI, effective chemical agents for post-CMP rinsing and cleaning are required since the removal of ceria particles after polishing is a major technical challenge.

Commodity based cleaning approaches typically involve citric acid or SC1 (5 parts $H_2O$, 1 part $NH_4OH$, 1 part $H_2O_2$), which leaves significant amounts of residues on the wafer. Dilute hydrofluoric acid (DHF) has the drawback that prolonged exposure can lead to unacceptably high material loss. SPM (1 part $H_2SO_4$, 4 parts $H_2O_2$) has cost inefficiencies associated with longer process times and increased equipment and facility requirements. Improved schemes for post-CMP cleaning are required to have diminished defects such as CMP footprint. Furthermore, replacement of DHF with a chemical agent, which is less hazardous and provides higher process flexibility, is an attractive benefit of a properly designed chemical agent for post-CMP cleaning.

The great surface chemical action of ceria particles generally enables a higher TEOS (silicon oxide film (TEOS-$SiO_2$) obtained by forming a TEOS film on a raw material) removal rate as compared with conventional silica particles. However, the high affinity of ceria for TEOS also results in a technical challenge for removing ceria particles from $SiO_2$. Finally, it may be desirable to formulate a rinsing or cleaning chemical agent which can be used at up to a high rate of dilution, for example, for on-platen post-CMP rinsing and post-CMP brush box cleaning.

SUMMARY

According to the present invention, a composition for rinsing or cleaning a surface to which ceria particles are attached and a method for removing ceria particles from the surface using the same.

The present invention has the following aspects.

(1) A composition an anionic surfactant, an organic amine compound, and a protic organic acid molecule, in which the composition has a pH of less than 6.

(2) The composition according to (1), in which the anionic surfactant is represented by the following Formula (I):

[Chemical Formula 1]

$$C_mH_{2m+1}-(OCH_2CH_2)_n-L-R \qquad (I)$$

(where 6≤m≤20, n≥5, L represents an —O—, —S—, —$R^1$—, —S—$R^1$— or —O—$R^1$— bond (where $R^1$ represents $C_{1-4}$ alkylene), and R represents an anionic group), the organic amine compound is at least one selected from the group consisting of 2-(diethylamino)ethanethiol, captamine, diethylethanolamine, methylcysteamine, 2-(tert-butylamino)ethanethiol, 2,2'-dimethoxy-1,1-dimethyl-dimethylamine, 3-amino-4-octanol, 3-butoxypropylamine, N-acetylcysteamine, homocysteamine, N,N-dimethylhydroxylamine, 2-(isopropylamino)ethanol, 2-(methylthioethyl)amine, 1-aminopropane-2-thiol, leucinol, cysteamine, and N,O-dimethylhydroxylamine, and the protic organic acid molecule is at least one selected from the group consisting of glyphosin, N-(phosphonomethyl)iminodiacetic acid hydrate, hydroxyphosphonoacetic acid, citric acid, hydroxyethane-1,1-diphosphonic acid, and 2-phosphonobutane-1,2,4-tricarboxylic acid.

(3) The composition according to (1), in which the anionic surfactant is represented by the following Formula (I):

[Chemical Formula 2]

$$C_mH_{2m+1}-(OCH_2CH_2)_n-L-R \qquad (I)$$

(where 6≤m≤20, n≥5, L represents an —O—, —S—, —$R^1$—, —S—$R^1$— or —O—$R^1$— bond (where $R^1$ represents $C_{1-4}$ alkylene), and R represents an anionic group), the organic amine compound has a sum of electronegativity gradients (SENG) of greater than −1.0, and the protic organic acid molecule has at least one dissociated complexing functional group; in which a density of binding modes (DBM) for the functional group(s) of the molecule is 0.013 or more.

(4) The composition according to (2) or (3), in which 5≤n≤12 in the Formula (I).

(5) The composition according to any one of (1) to (4), in which R in the Formula (I) represents at least one selected from the group consisting of a carboxy group, a sulfo group, a phosphate group, and a salt group thereof.

(6) The composition according to any one of (1) to (5), in which the anionic surfactant is at least one selected from the group consisting of capryleth-9 carboxylic acid or a salt thereof.

(7) The composition according to any one of (1) to (6), in which the organic amine compound is at least one selected from the group consisting of 3-amino-4-octanol, cysteamine, N,N-dimethylhydroxylamine, and N,O-dimethylhydroxylamine.

(8) The composition according to any one of (1) to (7), in which the protic organic acid molecule is at least one selected from the group consisting of hydroxyethane-1,1-diphosphonic acid and 2-phosphonobutane-1,2,4-tricarboxylic acid.

(9) The composition according to any one of (1) to (8), which is used for cleaning or rinsing a surface to which ceria particles are attached.

(10) A surface treatment method for removing ceria particles from a surface to which the ceria particles are attached, the surface treatment method including a step of bringing the surface into contact with the composition according to any one of (1) to (9).

DETAILED DESCRIPTION

Hereinafter, modes for carrying out the present invention will be described. Incidentally, the present invention is not limited only to the following embodiments. In the present specification, "X to Y" indicating a range means "X or more and Y or less". In addition, in the present specification, operations and measurements of physical properties and the like are performed under the conditions of room temperature (20° C. to 25° C.)/relative humidity of 40% to 50% RH unless otherwise stated. According to the present invention, a composition for rinsing or cleaning a surface to which ceria particles are attached and a surface treatment method for removing ceria particles from the surface using the same are provided. In several embodiments, the surface to which the ceria particles are attached has been subjected to chemical mechanical polishing (CMP) in advance. In the present specification, the term "chemical mechanical polishing" or "planarization" refers to the process of planarizing (polishing) a surface by the combination of surface chemical reaction and mechanical wear. In several embodiments, the chemical reaction is initiated by applying a composition (synonymously referred to as "polishing slurry", "polishing composition", "slurry composition" or simply "slurry") which can react with the surface material, thus converts the surface material into a product, and can be more easily removed by simultaneous mechanical wear to a surface. In several embodiments, mechanical wear is performed by bringing a polishing pad into contact with a surface and moving the polishing pad with respect to the surface.

<Composition>

The composition according to an embodiment of the present invention contains an anionic surfactant, an organic amine compound, and a protic organic acid molecule and has a pH of less than 6. The composition according to the present embodiment may contain components other than these components but is preferably composed substantially of these components and is more preferably composed of these components.

[Anionic Surfactant]

The anionic surfactant is represented by the following Formula (I).

[Chemical Formula 3]

$$C_mH_{2m+1}\text{—}(OCH_2CH_2)_n\text{-L-R} \quad \text{(I)}$$

(where $6 \leq m \leq 20$, $n \geq 5$, L represents an —O—, —S—, —R$^1$—, —S—R$^1$— or —O—R$^1$— bond (where R$^1$ represents $C_{1-4}$ alkylene), and R represents an anionic group).

In Formula (I), m (representing the number of carbon atoms in the terminal alkyl group) is an integer 6 or more and 20 or less (6, 7, 8, 9, 10, 11, 12, 13, 14, 15, 16, 17, 18 19 or 20). m is preferably 7 or more and 10 or less and more preferably 8. It is not preferable that m is less than 6 since the hydrophilicity is enhanced and the ceria removal performance may be insufficient. It is not preferable that m is more than 20 since the hydrophobicity is enhanced and the ceria removal performance may be insufficient.

In Formula (I), n (the number of moles of ethylene oxide added) is an integer 5 or more (an integer greater than 5, 6, 7, 8, 9, 10 or 11). n is preferably 5 or more and 12 or less, more preferably 6 or more and 12 or less, still more preferably 7 or more and 10 or less, and particularly preferably 8. It is not preferable that n is less than 5 since the hydrophilicity is enhanced and the ceria removal performance may be insufficient. The upper limit of n is not particularly limited, but it is not preferable that the upper limit of n is more than 12 since the hydrophilicity is enhanced and the ceria removal performance may be insufficient.

In Formula (I), L represents a divalent group and is —O—, —S—, —R$^1$—, —S—R$^1$— or —O—R$^1$—. In a case in which L is —R$^1$—, —S—R$^1$— or —O—R$^1$—, R$^1$ represents an alkylene group having 1 to 4 carbon atoms (methylene group, ethylene group, trimethylene group, propylene group, tetramethylene group, or the like).

In Formula (I), R represents an anionic group. From the viewpoint of the adsorptive power of anionic group, R is preferably at least one selected from the group consisting of a carboxy group, a sulfo group, a phosphate group, and a salt group thereof and more preferably at least one selected from the group consisting of a carboxy group and a salt group thereof.

As the anionic surfactant represented by Formula (I), a polyoxyethylene alkylene ether carboxylic acid represented by the following Formula (II) or a salt thereof is preferable from the viewpoint described above.

[Chemical Formula 4]

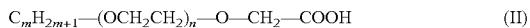

$$C_mH_{2m+1}\text{—}(OCH_2CH_2)_n\text{—}O\text{—}CH_2\text{—}COOH \quad \text{(II)}$$

(where m and n have the same definition as those in Formula (I)).

A preferred form of m and n in Formula (II) is the same as that in Formula (I), and thus detailed description thereof is omitted here.

The anionic surfactant represented by Formula (II) is not particularly limited, but examples thereof include capryleth-6 carboxylic acid (in Formula (II), m=8, n=5) or a salt thereof, capryleth-9 carboxylic acid (in Formula (II), m=8, n=8) or a salt thereof, and the like. Among these, capryleth-9 carboxylic acid or a salt thereof is preferable and capryleth-9 carboxylic acid is more preferable from the viewpoint of ceria removal performance. Only one kind of these compounds may be used singly, or two or more kinds thereof may be used in combination.

The anionic surfactant can have certain functional characteristics. For example, in several embodiments, the anionic surfactant has a specific critical micelle concentration (CMC) (for example, CMC between about 250 mg/l to about 350 mg/l). The lower limit of the critical micelle concentration (CMC) is preferably 50 mg/l or more, more preferably 100 mg/l or more, still more preferably 150 mg/l or more, particularly preferably 200 mg/l or more, and most preferably 250 mg/l or more from the viewpoint of solubility. The upper limit of the critical micelle concentration (CMC) is preferably 350 mg/l or less and more preferably 300 mg/l or less from the viewpoint of electrical conductivity. In the present specification, the critical micelle concentration (CMC) is determined by the following electrical conductivity method.

In other words, a surfactant solution adjusted to a predetermined concentration is dropped into 100 ml of distilled water little by little (for example, 0.1 ml at one time) while performing stirring, and the electrical conductivity is measured every time the surfactant solution is dropped. The inflection point when the electrical conductivity measured is plotted with respect to the surfactant concentration C=a×b/(100+b), where a represents the surfactant concentration (mol/l) in the titrant and b represents the volume (ml) of the titrant titrated, is taken as CMC.

Incidentally, the factors that increase CMC include short alkyl groups; double bonds; branch points in chemical structures (formed in bile acid and the like); increases in temperature of nonionic surfactants; and the like. The factors that decrease CMC include long alkyl groups; increases in counter ion concentration in ionic surfactants, and the like.

In several embodiments in which the anionic surfactant is a polyoxyethylene alkyl ether carboxylic acid, the polyoxyethylene alkyl ether carboxylic acid has a hydrophilic-lipophilic balance (HLB) value by Davies method of greater than 7. In several embodiments, the polyoxyethylene alkyl ether carboxylic acid has an HLB value of 7.8 or more. The lower limit of the HLB value is usually 3 or more, preferably 4 or more, more preferably 5 or more, still more preferably 6 or more, and particularly preferably 7 or more from the viewpoint of hydrophilicity. The upper limit of the HLB value is preferably 20 or less, more preferably 16 or less, still more preferably 12 or less, and yet more preferably 10 or less from the viewpoint of critical micelle formation. In the present specification, the hydrophilic-lipophilic balance (HLB) value by Davies method is determined by "7+ total number of hydrophilic groups—total number of lipophilic groups" based on Davis, J. T.; Proc. Intern. Congr. Surface Activity, 2nd, London, 1, 426 (1957).

[Organic Amine Compound]

The organic amine compound is preferably a non-aromatic amine which does not contain an aromatic ring. The organic amine compound preferably has a hydroxy group, an alkoxy group or a thiol group.

The organic amine compound is not particularly limited, but examples thereof include 2-(diethylamino)ethanethiol, captamine, diethylethanolamine, methylcysteamine, 2-(tert-butylamino)ethanethiol, 2,2'-dimethoxy-1,1-dimethyl-dimethylamine, 3-amino-4-octanol (CORRGUARD (registered trademark) EXT), 3-butoxypropylamine, N-acetylcysteamine, homocysteamine, N,N-dimethylhydroxylamine, 2-(isopropylamino)ethanol, 2-(methylthioethyl)amine, 1-aminopropane-2-thiol, leucinol, cysteamine, and N,O-dimethylhydroxylamine. Among these, 3-amino-4-octanol, cysteamine, N,N-dimethylhydroxylamine, and N,O-dimethylhydroxylamine are preferable, 3-amino-4-octanol, cysteamine, and N,O-dimethylhydroxylamine are more preferable, and 3-amino-4-octanol is still more preferable from the viewpoint of ceria removal performance. Only one kind of these compounds may be used singly, or two or more kinds thereof may be used in combination.

The organic amine compound preferably has a sum of electronegativity gradients (SENG) of greater than −1.0. In the present specification, the "sum of electronegativity gradients (SENG)" is an index indicating ceria removal performance and is determined by the following method.

The electronegativity gradient (ENG) means a value acquired by adding a specific sign (+ or −) to the absolute value of the difference in electronegativity between atoms involved in a bond. Here, the value of Pauling's electronegativity is adopted as the electronegativity. The electronegativity of major atoms is presented below.

H: 2.1
C: 2.5
N: 3.0
O: 3.4
P: 2.2
S: 2.6.

The "specific sign" is defined as follows.

In a case in which the absolute value is an absolute value of the difference in electronegativity between bonds containing atoms of which the electronegativity value is greater (3.0 or more) than the electronegativity of nitrogen atom and is more than 0.5, minus (−) is added (defined to be hydrophilic in the present specification) as the "specific sign". In cases other this case (namely, a case in which the bond is composed only of atoms of which the electronegativity value is equal to or less (less than 3.0) than the electronegativity of nitrogen atom and a case in which the absolute value is 0.5 or less even though the bond is a bond containing an atom of which the electronegativity value is more (3.0 or more) than the electronegativity of nitrogen atom), plus (+) is added (defined to be hydrophobic in the present specification) as the "specific sign".

SENG is calculated as the sum of electronegativity gradients for all bonds in one molecule as shown in Mathematical Expression 1.

[Math. 1]

$$SENG=\Sigma(sign)\times(\text{absolute value of difference in electronegativity})$$ Mathematical Expression 1

Hereinafter, the sum of electronegativity gradients will be specifically described by taking cysteamine as an example.

[Chemical Formula 5]

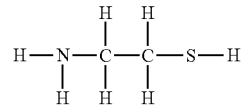

Cysteamine has four C—H bonds, two N—H bonds, one S—H bond, one C—N bond, and one S—C bond. The sign and the absolute value of the difference in electronegativity for each bond is as follows.

C—H bond: (+), 0.4
N—H bond: (−), 0.9
S—H bond: (+), 0.5
C—N bond: (+), 0.5
S—C bond: (+), 0.1.

Hence, SENG is calculated as 0.4×4+(−0.9×2)+0.5×1+ 0.5×1+0.1×1=0.9.

It is preferable that SENG is greater than −1.0 since ceria removal performance is enhanced. SENG is preferably 0.0 or more, more preferably 1.0 or more, still more preferably 2.0 or more, and most preferably greater than 2.5.

SENG of various organic amine compounds is presented below.

TABLE 1

| Organic amine compound | Amino type | SENG (—) |
| --- | --- | --- |
| 2-(Diethylamino)ethanethiol | Thiol | 7.7 |
| Captamine | Thiol | 6.1 |
| Diethylethanolamine | Alcohol | 4.1 |
| 2-(tert-Butylamino)ethanethiol | Thiol | 5.9 |
| 3-Amino-4-octanol (EXT) | Alcohol | 2.9 |
| 3-Butoxypropylamine | Ether | 2.9 |
| N,N-Dimethylhydroxylamine | Alcohol | 2.5 |
| 1-Aminopropane-2-thiol | Thiol | 1.7 |
| Cysteamine | Thiol | 0.9 |
| N,O-Dimethylhydroxylamine | Alcohol | 1.5 |

[Protic Organic Acid Molecule]

The protic organic acid molecule is not particularly limited, but examples thereof include glyphosin, N-(phosphonomethyl)iminodiacetic acid hydrate, hydroxyphosphonoacetic acid, citric acid, hydroxyethane-1,1-diphosphonic acid, and 2-phosphonobutane-1,2,4-tricarboxylic acid. Among these, hydroxyethane-1,1-diphosphonic acid and 2-phosphonobutane-1,2,4-tricarboxylic acid are preferable from the viewpoint of chemical coordination of these molecules to ceria. Only one kind of these compounds may be used singly, or two or more kinds thereof may be used in combination.

According to an embodiment of the present invention, the protic organic acid molecule has at least one (preferably two or more) dissociated complexing functional group, and the density of binding modes (DBM) for the functional group(s) of the molecule is 0.013 or more. In the present specification, the "dissociated complexing functional group" refers to a proton donating group having an unshared electron pair. In the present specification, the "density of binding modes (DBM)" is an index indicating ceria removal performance and is determined by the following Mathematical Expression 2.

[Math. 2]

$$DBM = NBM/(IMD \times Mw)$$  Mathematical Expression 2

DBM: Density of binding modes
NBM: Number of binding modes
IMB: Number of carbon atoms between dissociated complexing functional groups
Mw: Molecular weight In Mathematical Expression 2 above, NBM represents the number of binding modes. NBM is determined as follows when citric acid is taken as an example.

[Chemical Formula 6]

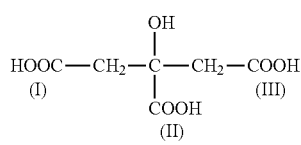

As shown in the formula, citric acid has three carboxy groups (COOH) as dissociated complexing functional groups. The carboxy group is in (1) a case (monodentate coordination) in which the carboxy group itself donates a proton to be a carboxylate anion (COO⁻) and forms an ionic bond with a cation and (2) a case (bidentate coordination) in which two carboxy groups become ligands to form a complex. The monodentate coordination of (1) can occur at each of the three carboxy groups, and thus three coordination patterns are conceivable in the monodentate coordination of (1). Meanwhile, in the bidentate coordination of (2), two patterns of a pattern in which the carboxy groups of (I) and (II) become ligands; and a pattern in which the carboxy groups of (II) and (III) become ligands are conceivable. (Incidentally, the carboxy groups of (I) and (III) are not considered since the locations thereof are separated from each other and these hardly chemically become ligands.) Hence, NBM of citric acid is calculated as 3+2=5.

In Mathematical Expression 2 above, IMD represents the average value of the number of carbon atoms (branching is not considered) between dissociated complexing functional groups. When citric acid is taken as an example, IMD which is the average value is calculated as (2+2)/2=2 since the number of carbon atoms between the carboxy groups of (I) and (II) is 2 and the number of carbon atoms between the carboxy groups of (II) and (III) is 2.

In Mathematical Expression 2 above, Mw represents the molecular weight. When citric acid is taken as an example, Mw is 192 (g/mol).

Hence, DBM is calculated as 5/(2×192)=0.013 by Mathematical Expression 2. Examples of the dissociated complexing functional group include a phosphate group, a carboxy group, and a sulfo group. Among these, a phosphate group is preferable from the viewpoint of adsorption to ceria. In other words, the protic organic acid molecule preferably contains at least one phosphate group. Only one or two or more of these groups may be contained in one molecule.

In several embodiments, the protic organic acid molecule substantially does not contain low trace metals. In several embodiments, the protic organic acid molecule contains at least 2, 3, 4, 5 or 6 dissociated complexing functional groups.

In several embodiments, DBM is 0.006 or more, 0.008 or more, 0.010 or more, 0.012 or more, or 0.014 or more.

In several embodiments, DBM is 0.020 or less, 0.018 or less, or 0.016 or less.

In several embodiments, the protic organic acid molecule has an absolute value of electronegativity gradients (ENG) between dissociated electron-donating O⁻ and an atom to which the O⁻ is bonded of 0.9 or more, 1.0 or more, 1.1 or more, or 1.2 or more. In several embodiments, the protic organic acid molecule has a specific static dipole polarizability gradient (SDPG). In the present specification, the "static dipole polarizability gradient (SDPG)" is an index indicating ceria removal performance and is determined by the following method.

SDPG is a unique value determined depending on the kind of protic group (phosphate group, carboxy group, sulfo group and the like) contained in the protic organic acid molecule and is determined by the following Mathematical Expression 3.

[Math. 3]

SDPG=absolute value of difference in polarizability of neutral atoms/number of electron localization patterns   Mathematical Expression 3

The polarizabilities of the main neutral atoms are presented below (reference: Table of experimental and calculated static dipole polarizabilities for the electronic ground states of the neutral elements (in atomic units)).

H: 4.5
C: 11.0
N: 7.6
O: 6.0
P: 24.7
S: 19.6.

For example, SDPG of the carboxy group is calculated as |11.0−6.0|/1=5.0. SDPG of the phosphate group is calculated as |24.7−6.0|/2=9.4.

In several embodiments, the protic organic acid molecule has a DBM×(absolute value of ENG)×SDPG value (value acquired by multiplying DBM, absolute value of ENG, and SDPG) of 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, or 0.17 or more.

The DBM×(absolute value of ENG)×SDPG value is preferably 0.05 or more, more preferably 0.15 or more, and still more preferably 0.16 or more. When the DBM×(absolute value of ENG)×SDPG value is such a value, excellent ceria removal performance can be exerted.

In several embodiments, the protic organic acid molecule has a DBM×(absolute value of ENG)×SDPG value of 0.5 or less, 0.4 or less, or 0.3 or less.

The amount of the anionic surfactant contained in the composition is preferably 3 parts by mass or more and 30 parts by mass or less and preferably 5 parts by mass or more and 20 parts by mass or less with respect to 100 parts by mass of the amount of the organic amine compound. It is preferable that the content of the anionic surfactant is 3 parts by mass or more since ceria removal performance is effective. It is preferable that the content of the anionic surfactant is 30 parts by mass or less since ceria removal performance is effective.

The amount of the protic organic acid molecule contained in the composition is preferably 60 parts by mass or more and 95 parts by mass or less and preferably 70 parts by mass or more and 85 parts by mass or less with respect to 100 parts by mass of the amount of the organic amine compound. It is preferable that the content of the protic organic acid molecule is 60 parts by mass or more since ceria removal performance is effective. It is preferable that the content of the protic organic acid molecule is 95 parts by mass or less since ceria removal performance is effective.

The composition is used by being diluted if necessary when being used in the surface treatment method to be described below. According to several embodiments, the composition can be diluted so that the concentration of each component becomes ½ to ¹⁄₂₀. As the concentration of each component in the composition when being used in the surface treatment, the concentration of the anionic surfactant is preferably 0.05% by mass or more and 0.15% by mass or less, the concentration of the organic amine compound is preferably 0.5% by mass or more and 1.5% by mass or less, and the concentration of the protic organic acid molecule is preferably 0.3% by mass or more and 1.5% by mass or less.

In several embodiments, each concentration in the composition when being used in the surface treatment is 0.088% by mass for the anionic surfactant, 0.83% by mass for the organic amine compound, and 0.66% by mass for the protic organic acid molecule.

[pH Adjusting Agent]

The composition according to the present embodiment can further contain a pH adjusting agent in order to adjust the pH to a desired pH value. Incidentally, in the present specification, the "anionic surfactant", "organic amine compound" and "protic organic acid molecule" described above are not included in the pH adjusting agent.

The pH adjusting agent is not particularly limited, and known pH adjusting agents used in the present technical field can be used. Among these, known acids, bases, salts, amines, chelating agents and the like are preferably used.

As the content of the pH adjusting agent in the composition, an amount may be appropriately selected so as to have a desired pH value and it is preferable to add the pH adjusting agent in an amount so as to have a preferred pH value described above.

[Other Additives]

The composition may contain other additives at arbitrary proportions if necessary as long as the effects of the present invention are not impaired. However, it is desirable not to add components other than the essential components of the composition as far as possible since these may be the causes of defects, thus it is preferable that the added amount thereof is as small as possible and it is more preferable not to contain other additives. Examples of other additives include a wetting agent, an antiseptic agent, a dissolved gas, a reducing agent, an oxidizing agent and the like.

In several embodiments, the composition does not contain polymer particles or a sulfate surfactant.

[Dispersing Medium]

The composition contains a dispersing medium (solvent) if necessary. The dispersing medium has a function of dispersing or dissolving the respective components. The dispersing medium preferably contains water and is more preferably only water. In addition, the dispersing medium may be a mixed solvent of water and an organic solvent for dispersion or dissolution of the respective components. In this case, examples of the organic solvent used include acetone, acetonitrile, ethanol, methanol, isopropanol, glycerin, ethylene glycol, propylene glycol and the like that are an organic solvent miscible with water. In addition, these organic solvents may be used without being mixed with water, the respective components may be dispersed or dissolved in these organic solvents, and then the dispersions or solutions may be mixed with water. These organic solvents may be used singly or in combination of two or more kinds thereof.

Water is preferably water which does not contain impurities as little as possible from the viewpoint of inhibiting the contamination of the object to be subjected to surface treatment and the action of other components. For example, water in which the total content of transition metal ions is 100 ppb or less is preferable. Here, the purity of water can be increased by, for example, operations such as removal of impurity ions using an ion exchange resin, removal of foreign matters using a filter, distillation and the like. Specifically, as water, it is preferable to use, for example, deionized water (ion-exchanged water), pure water, ultrapure water, distilled water and the like.

[pH Value]

The pH value of the composition is less than 6, preferably less than 5, and more preferably less than 4. The lower limit of the pH of the composition is preferably 2 or more and more preferably 3 or more. Incidentally, the pH value in the present specification is determined using a pH meter (trade name: LAQUA (registered trademark) manufactured by HORIBA, Ltd.).

[Method for Producing Composition]

Another embodiment of the present invention relates to a method for producing a composition including mixing an anionic surfactant, an organic amine compound, and a protic organic acid molecule together. In the method for producing a composition according to the present embodiment, the other additives, dispersing medium, and pH adjusting agent described above may be further mixed if necessary.

The mixing method such as the mixing conditions, mixing order and the like of these is not particularly limited, and known ones can be used. The temperature when the respective components are mixed together is not particularly limited but is preferably 10° C. to 40° C., and heating may be performed in order to increase the rate of dissolution.

The composition of the present embodiment described above is suitably used in the surface treatment (cleaning or rinsing) of a surface to which ceria particles are attached.

<Surface Treatment Method>

Another embodiment of the present invention relates to a surface treatment method for removing ceria particles from a surface to which the ceria particles are attached, which includes a step of bringing the surface into contact with the composition described above (hereinafter, also referred to as "composition for surface treatment" in order to distinguish it from the polishing composition). According to the surface treatment method, it is possible to easily remove the ceria particles from the surface of a polished object to be polished obtained after being polished using a polishing composition containing ceria particles. In other words, according to another embodiment of the present invention, a method for decreasing ceria particles, which includes removing the ceria particles from the surface of a polished object to be polished obtained after being polished using a polishing composition containing ceria particles is provided.

[Object to be Subjected to Surface Treatment]

The object to be subjected to surface treatment is a surface to which ceria particles are attached and preferably a polished object to be polished obtained after being polished using a polishing composition containing ceria particles. The polished object to be polished means an object to be polished after being polished in the polishing step. The polishing step is not particularly limited but is preferably a CMP step.

The polished object to be polished is preferably a polished semiconductor substrate and more preferably a semiconductor substrate after being subjected to CMP. Here, defects (particularly ceria particles) attached to the surface of the polished semiconductor substrate can be a cause of a decrease in performance of the semiconductor device. Hence, in a case in which the polished object to be polished is a polished semiconductor substrate, it is desirable to decrease these defects as much as possible in the surface treatment step of the semiconductor substrate.

The object to be subjected to surface treatment is not particularly limited but is preferably a polished object to be polished which contains silicon nitride, silicon oxide, or polysilicon and more preferably a polished object to be polished which contains silicon oxide since the effects of the present invention are more favorably exerted.

Examples of the polished object to be polished which contains silicon nitride, silicon oxide, or polysilicon include a polished object to be polished which is composed of a simple substance of each of silicon nitride, silicon oxide, or polysilicon, in addition to these, a polished object to be polished in a state in which materials other than silicon nitride, silicon oxide, or polysilicon are exposed on the surface and the like. Here, examples of the former include a silicon nitride substrate, a silicon oxide substrate, or a polysilicon substrate which is a semiconductor substrate, a substrate in which a silicon nitride film, a silicon oxide film or a polysilicon film is formed on the outermost surface, and the like. In addition, with regard to the latter, materials other than silicon nitride, silicon oxide, or polysilicon are not particularly limited, but examples thereof include tungsten and the like, specific examples include a polished semiconductor substrate having a structure in which a silicon nitride film or a silicon oxide film is formed on tungsten, a polished semiconductor substrate having a structure in which a tungsten portion, a silicon nitride film, and a silicon oxide film are exposed on the outermost surface, and the like.

Incidentally, examples of the polished object to be polished which contains silicon oxide include a TEOS type silicon oxide film (hereinafter, also simply referred to as "TEOS") formed using tetraethyl ortho-silicate as a precursor, an HDP film, a USG film, a PSG film, a BPSG film, an RTO film and the like.

[Surface Treatment]

Examples of the surface treatment mainly include (I) a method by a rinse treatment and (II) a method by a cleaning treatment. In other words, the surface treatment is preferably a rinse treatment or a cleaning treatment.

(I) Rinse Treatment

The rinse treatment refers to a surface treatment to be performed on a polishing platen (platen) to which a polishing pad is attached after the final polishing (finish polishing) of the object to be polished is performed for the purpose of removing defects (particularly ceria particles) on the surface of a polished object to be polished. At this time, the rinse treatment is performed by bringing the composition for surface treatment into direct contact with the object to be subjected to surface treatment. As a result, defects (particularly ceria particles) on the surface of the object to be subjected to surface treatment are removed by the frictional force (physical action) by the polishing pad and the chemical action by the composition for surface treatment.

Specifically, the rinse treatment can be performed by placing the surface after being subjected to the polishing step on the polishing platen (platen) of a polishing apparatus, bringing the polishing pad and the object to be subjected to surface treatment into contact with each other, and relatively sliding the object to be subjected to surface treatment and the polishing pad while supplying the composition for surface treatment to the contact portion.

As the polishing apparatus, it is possible to use a general polishing apparatus to which a holder for holding the object to be polished, a motor of which the number of revolutions can be changed, and the like are attached and which has a polishing platen to which a polishing pad (polishing cloth) can be attached.

The rinse treatment can be performed using either of a single-side polishing apparatus or a double-side polishing apparatus. Moreover, it is preferable that the above-described polishing apparatus is equipped with a discharge nozzle for the composition for surface treatment in addition to a discharge nozzle for the polishing composition. Specifically, as the polishing apparatus, for example, cleaning apparatus-integrated polishing apparatus MirraMesa manufactured by Applied Materials, Inc. and the like can be preferably used.

As the polishing pad, a general non-woven fabric, polyurethane, a porous fluororesin and the like can be used without particular limitation. It is preferable that the polishing pad has been subjected to grooving so as to retain the composition for surface treatment.

The rinse conditions are not particularly limited, and, for example, the number of revolutions of the polishing platen and the number of revolutions of the head (carrier) are preferably 10 rpm or more and 100 rpm or less and the pressure (polishing pressure) applied to the object to be polished is preferably 0.5 psi or more and 10 psi or less. The method for supplying the composition for surface treatment to the polishing pad is not particularly limited, and, for example, a method (free-flowing) in which the composition for surface treatment is continuously supplied to the polishing pad using a pump or the like is employed. There is no limitation on this supplied amount, but it is preferable that the surface of the polishing pad is always covered with the composition for surface treatment and the supplied amount is preferably 10 mL/min or more and 5000 mL/min or less. The treatment time is also not particularly limited but is preferably 5 seconds or more and 180 seconds or less in the step using the composition for surface treatment.

(II) Cleaning Treatment

The cleaning treatment refers to a surface treatment to be performed at a place other than the polishing platen (platen) after the final polishing (finish polishing) of the object to be polished is performed for the purpose of removing defects (particularly ceria particles) on the surface of a polished object to be polished. In the cleaning treatment as well, defects (particularly ceria particles) on the surface of the object to be subjected to surface treatment are removed by bringing the composition for surface treatment into direct contact with the object.

An example of the method for performing the cleaning treatment includes (i) a method in which the cleaning brush is brought into contact with one side or both sides of the object to be subjected to surface treatment in a state in which the object to be subjected to surface treatment is held and the surface of the object to be subjected to surface treatment is rubbed with the cleaning brush while supplying the composition for surface treatment to the contact portion, (ii) a method (dipping method) in which the object to be subjected to surface treatment is dipped in the composition for surface treatment and subjected to an ultrasonic treatment and stirring, and the like. In such methods, defects (particularly ceria particles) on the surface of the object to be polished are removed by the frictional force by the cleaning brush or the mechanical force generated by the ultrasonic treatment or stirring and the chemical action by the composition for surface treatment. In the method of (i) above, the method for bringing the object to be subjected to surface treatment into contact with the composition for surface treatment is not particularly limited, but examples thereof include a spin method in which the object to be subjected to surface treatment is rotated at a high speed while allowing the composition for surface treatment to flow from the nozzle onto the object to be subjected to surface treatment, a spray method in which the object to be subjected to surface treatment is cleaned by spraying the composition for surface treatment onto the object, and the like.

The apparatus for performing the cleaning treatment is not particularly limited, but a polishing apparatus (brush box) equipped with a cleaning facility capable of rubbing the object to be subjected to surface treatment with a cleaning brush is preferable. As the cleaning brush, it is particularly preferable to use PVA sponge. The cleaning conditions are also not particularly limited and can be appropriately set depending on the kind of object to be subjected to surface treatment and the kind and amount of defects to be removed.

As the surface treatment in the surface treatment method according to the present embodiment, only either of (I) rinse treatment or (II) cleaning treatment may be performed or both (I) rinse treatment and (II) cleaning treatment may be performed. In the case of combining (I) rinse treatment with (II) cleaning treatment, it is preferable that (II) cleaning treatment is performed after (I) rinse treatment. By combining (I) rinse treatment with (II) cleaning treatment, it is possible to more effectively remove ceria particles as compared with the case in which only either of (I) rinse treatment or (II) cleaning treatment is performed.

After the surface treatment method according to the present embodiment, a step of further rinsing or cleaning the surface with water may be provided if necessary.

EXAMPLES

Example 1

In order to test ceria removal performance, a cleaning composition which contained an organic amine compound in the amount presented in the following Table 2 and was adjusted to have a pH of 3.5 using maleic acid was prepared. The ceria-polished TEOS specimen was immersed in the cleaning composition and stirred at 800 rpm for 1 minute to determine the amount of ceria removed. After the ceria-polished TEOS specimen was taken out from the cleaning composition, the absorbance of the ultraviolet-visible peak for the ceria-cleaning composition retain was calculated, and the absorbance of the peak (wavelength: 340 to 450 nm) corresponding to the pure cleaning composition was subtracted from this absorbance to determine the amount of ceria remaining in the cleaning composition (namely, the amount of ceria removed from the TEOS specimen). SENG was calculated on the assumption that an electron cloud was able to be shared between all atoms bonded to an atom.

TABLE 2

Components of cleaning composition and ceria removal performance

| | Organic amine compound | | | | Amount of ceria |
|---|---|---|---|---|---|
| | Amount (% by mass) | pKa (—) | SENG | pH* | removed (% by mass) |
| Monoethanolamine | 0.022 | 9.5 | −3.1 | 3.5 | 0.006 |
| Ammonium ion | 0.0065 | 9.3 | −3.6 | 3.5 | 0.007 |
| N,N-Dimethyl-hydroxylamine | 0.022 | 5.2 | 2.5 | 3.5 | 0.01 |
| N,O-Dimethyl-hydroxylamine | 0.022 | 4.8 | 1.5 | 3.5 | 0.014 |
| Cysteamine | 0.028 | 10.5 | 0.9 | 3.5 | 0.014 |

*Adjusted to pH 3.5 using maleic acid.

Example 2

In order to test ceria removal performance, a cleaning composition which contained a protic organic acid molecule in the amount presented in the following Table 3 and was adjusted to have a pH of 3.5 with diethylene glycol amine (DEGA) was prepared. The ceria-polished TEOS specimen was immersed in the cleaning composition and stirred at 800 rpm for 1 minute to determine the amount of ceria removed. After the ceria-polished TEOS specimen was taken out from the cleaning composition, the absorbance of the ultraviolet-visible peak for the ceria-cleaning composition retain was calculated, and the absorbance of the peak corresponding to the pure cleaning composition was subtracted from this absorbance to determine the amount of ceria remaining in the cleaning composition (namely, the amount of ceria removed from the TEOS specimen). An amount of ceria removed of 0.1% by mass or more is considered to be favorable and an amount of ceria removed of 0.13% by mass or more is considered to be significantly favorable.

TABLE 3

Components of cleaning composition and ceria removal performance

| Protic organic acid molecule | Amount (% by mass) | DBM | Functional group Absolute value of ENG (type) | SDPG (type) | DBM × |ENG| | DBM × |ENG| × SDPG | pH* | Amount of ceria removed (% by mass) |
|---|---|---|---|---|---|---|---|---|
| Ethylenediaminetetraacetic acid (EDTA) | 0.48 | 0.005 | 0.9 (Carboxylic acid) | 5.0 (Carboxylic acid) | 0.0045 | 0.023 | 3.5 | 0.0050 |
| Glyphosin (PMG) | 0.43 | 0.005 | 1.2 (Phosphonic acid) | 9.4 (Phosphonic acid) | 0.0060 | 0.056 | 3.5 | 0.012 |
| N-(Phosphonomethyl)iminodiacetic acid hydrate (PMIDA) | 0.37 | 0.006 | 1.2 (Phosphonic acid) | 9.4 (Phosphonic acid) | 0.0072 | 0.068 | 3.5 | 0.012 |
| Malic acid | 0.22 | 0.007 | 0.9 (Carboxylic acid) | 5.0 (Carboxylic acid) | 0.0063 | 0.032 | 3.5 | 0.010 |
| Glutaric acid | 0.22 | 0.008 | 0.9 (Carboxylic acid) | 5.0 (Carboxylic acid) | 0.0072 | 0.036 | 3.5 | 0.010 |
| Maleic acid | 0.19 | 0.009 | 0.9 (Carboxylic acid) | 5.0 (Carboxylic acid) | 0.0081 | 0.041 | 3.5 | 0.0074 |
| Aspartic acid | 0.22 | 0.011 | 0.9 (Carboxylic acid) | 5.0 (Carboxylic acid) | 0.0099 | 0.050 | 3.5 | 0.011 |
| Hydroxyphosphonoacetic acid (HPAA) | 0.26 | 0.013 | 1.2 (Phosphonic acid) | 9.4 (Phosphonic acid) | 0.016 | 0.15 | 3.5 | 0.013 |
| Citric acid | 0.31 | 0.013 | 0.9 (Carboxylic acid) | 5.0 (Carboxylic acid) | 0.012 | 0.06 | 3.5 | 0.013 |
| Hydroxyethane-1,1-diphosphonic acid (HEDP) | 0.34 | 0.015 | 1.2 (Phosphonic acid) | 9.4 (Phosphonic acid) | 0.018 | 0.17 | 3.5 | 0.017 |
| 2-Phosphonobutane-1,2,4-tricarboxylic acid (PBTC) | 0.44 | 0.015 | 1.2 (Phosphonic acid) | 9.4 (Phosphonic acid) | 0.018 | 0.17 | 3.5 | 0.017 |

*The pH was adjusted to 3.5 using diethylene glycol amine (DEGA).

Example 3

In order to test ceria removal performance, a cleaning composition which contained an anionic surfactant in the amount presented in the following Table 4 and was adjusted to have a pH of 3.5 with diethylene glycol amine (DEGA) was prepared. Thereafter, the absorbance of the ultraviolet-visible peak for the ceria-cleaning composition retain was determined by the same method as in Example 1 and the peak corresponding to the pure cleaning composition ($\lambda$=340 to 350 nm) was subtracted from this absorbance. The value of the difference is proportional to the amount of ceria remaining in the cleaning composition (namely, the amount of ceria removed from the TEOS specimen), and it indicates that the amount of ceria removed is greater as the value of the difference is larger. It has been demonstrated that a surfactant having a higher hydrophilic-lipophilic (HLB) value by Davies method or a higher degree of ethoxylation is able to increase the amount of ceria removed. It seems that these parameters are all related to the critical micelle concentration (CMC). It is considered that a concentration greater than CMC is less effective in the removal of ceria particles since several surfactant molecules form micelles and the reactive functional groups of individual surfactants face away from the ceria particles on the wafer surface. As CMC of the surfactant increases, more functional groups of the surfactant can remove ceria particles from the surface. As can be seen from the following Table 4, an increase in HLB value by Davies method, degree of ethoxylation (n), or CMC generally can increase the amount of ceria removed. In addition to CMC, for example, negative charges or free electron pairs on oxygen atoms in functional groups can increase the amount of ceria removed by causing the reduction $Ce^{4+}(CeO_2)^+e' \to Ce^{3+}$ (free ion). In general, the electronegativity of an electron donating atom, for example, oxygen, should be lower than the electronegativity of the atom to which the electron donating atom is bonded, and this is because the electron density is concentrated to the latter.

TABLE 4

Components of cleaning composition and ceria removal performance

| Anionic surfactant $C_mH_{2m+1}$—$(OCH_2CH_2)_n$—O—$CH_2$—COOH | | | | | | Difference between |
|---|---|---|---|---|---|---|
| | m | n | HLB value by Davies method (—) | Critical micelle concentration (CMC) (mg/l) | pH* (—) | ultraviolet-visible region in ceria removal curve |
| Laureth-4 carboxylic acid | 12 | 3 | 4.1 | 23.3 | 3.5 | 169 |
| Crypleth-6 carboxylic acid | 8 | 5 | 6.8 | 102.5 | 3.5 | 257 |
| Crypleth-9 carboxylic acid | 8 | 8 | 7.8 | 257.8 | 3.5 | 318 |

*The pH was adjusted to 3.5 using diethylene glycol amine (DEGA).

Example 4

To water as a dispersing medium, the anionic surfactant, organic amine compound, and protic organic acid molecule presented in Table 5 were added so as to be at 0.088% by mass, 0.83% by mass, and 0.66% by mass, respectively, and these were stirred and mixed together to prepare a composition. Incidentally, the pH of compositions 1 to 3 was adjusted to 3.5 using maleic acid after stirring and mixing.

The amount of ceria particles removed was evaluated using the compositions obtained, by the same method as in Example 1. The results are presented in Table 5.

TABLE 5

| Composition | Anionic surfactant | Organic amine compound | Protic organic acid molecule | pH | Amount of ceria removed (% by mass) |
|---|---|---|---|---|---|
| 1 | Nil | DEGA | HEDP | 3.5 | 0.015 |
| 2 | Nil | DEGA | PBTC | 3.5 | 0.012 |
| 3 | Nil | EXT | PBTC | 3.5 | 0.020 |
| 4 (present invention) | Capryleth-9 carboxylic acid | EXT | HEDP | 3.5 | 0.030 |

HEDP: Hydroxyethane-1,1-diphosphonic acid
PBTC: 2-Phosphonobutane-1,2,4-tricarboxylic acid
DEGA: Diethylene glycol amine
EXT: 3-Amino-4-octanol As presented in Table 5, the composition according to the present invention can effectively remove ceria particles.

EQUIVALENTS

The present technology is not to be limited in terms of the particular embodiments described in this application, which are intended as single illustrations of individual aspects of the present technology. Many modifications and variations of this present technology can be made without departing from its spirit and scope, as will be apparent to those skilled in the art. Functionally equivalent methods and apparatuses within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, reagents, compounds compositions, or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

All numerical designations, e.g., pH, temperature, time, concentration, amounts, and molecular weight, including ranges, are approximations which are varied (+) or (−) by 10%, 1%, or 0.1%, as appropriate. It is to be understood, although not always explicitly stated, that all numerical designations may be preceded by the term "about." As used herein, the term "about" will be understood by persons of ordinary skill in the art and will vary to some extent depending upon the context in which it is used. If there are uses of the term which are not clear to persons of ordinary skill in the art given the context in which it is used, "about" will mean up to plus or minus 10% of the particular term. It is also to be understood, although not always explicitly stated, that the reagents described herein are merely exemplary and that equivalents of such are known in the art.

All patents, patent applications, provisional applications, and publications referred to or cited herein are incorporated by reference in their entirety, including all figures and tables, to the extent they are not inconsistent with the explicit teachings of this specification.

Other embodiments are set forth in the following claims.

The following invention is disclosed in U.S. Provisional Application No. 62/745,027.

[1] A rinsing and/or cleaning composition containing:
an anionic surfactant represented by Formula (I):

[Chemical Formula 7]

$$C_mH_{2m+1}-(OCH_2CH_2)_n-L-R \qquad (I),$$

where $6 \leq m \leq 20$,
$n \geq 5$,
L is a bond, —O—, —S—, —$R^1$—, —S—$R^1$—, or —O—$R^1$—, where $R^1$ is a $C_{1-4}$ alkylene, and
R is an anionic group;
an organic amine compound having a sum of electronegativity gradients (SENG) greater than −1.0; and
a protic organic acid molecule having at least one dissociated complexing functional group where a density of binding modes for the functional group(s) of the molecule (DBM) is equal or greater than 0.013,
wherein the composition has a pH of less than 6.
[2] The rinsing and/or cleaning composition of [1], wherein $n \geq 6$.
[3] The rinsing and/or cleaning composition of [1], wherein $5 \leq n \leq 12$.
[4] The rinsing and/or cleaning composition of [1], wherein m=n=8.
[5] The rinsing and/or cleaning composition of [1], wherein R includes a moiety comprising a group selected from a carboxylic acid, a sulphonic acid, a phosphonic acid, and a salt thereof.
[6] The rinsing and/or cleaning composition of [1], wherein the composition comprises a corrosion inhibitor that comprises capryleth-9 carboxylic acid.
[7] The rinsing and/or cleaning composition of [1], wherein the anionic surfactant is a polyoxyethylene alkyl ether carboxylic acid.
[8] The rinsing and/or cleaning composition of [7], wherein the anionic surfactant has a hydrophilic-lipophilic balance (HLB) Davies' number of greater than 7.
[9] The rinsing and/or cleaning composition of [7], wherein the polyoxyethylene alkyl ether carboxylic acid contains a degree of ethoxylation of equal or greater than 8.

[10] The rinsing and/or cleaning composition of [1], wherein the anionic surfactant has a critical micelle concentration (CMC) equal or greater than 200 mg/l.

[11] The rinsing and/or cleaning composition of [1], wherein the anionic surfactant has a critical micelle concentration (CMC) between about 250 mg/l and about 350 mg/l.

[12] The rinsing and/or cleaning composition of [7], wherein the polyoxyethylene alkyl ether carboxylic acid has an HLB Davies' number of equal to or greater than 7.8.

[13] The rinsing and/or cleaning composition of [7], wherein the polyoxyethylene alkyl ether carboxylic acid is represented by:

[Chemical Formula 8]

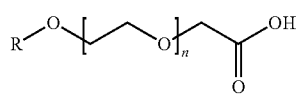

wherein R=$C_8H_{17}$ and n=8.

[14] The rinsing and/or cleaning composition of [1], wherein the organic amine compound has a SENG greater than 0.5.

[15] The rinsing and/or cleaning composition of [1], wherein the organic amine compound comprises an amine moiety and at least one molecular end of the organic amine compound contains at least one moiety without a nitrogen or oxygen atom.

[16] The rinsing and/or cleaning composition of [15], wherein the at least one moiety without a nitrogen or oxygen atom is selected from an alkyl moiety and a thiol moiety (SH).

[17] The rinsing and/or cleaning composition of [1], wherein the organic amine compound is selected from cysteamine, N,N-dimethylhydroxylamine, and N,O-dimethylhydroxylamine.

[18] The rinsing and/or cleaning composition of [1], wherein the organic amine compound is a nonaromatic amine.

[19] The rinsing and/or cleaning composition of [1], wherein the protic organic acid molecule is a phosphonic acid.

[20] The rinsing and/or cleaning composition of [1], wherein the protic organic acid molecule is hydroxyethane-1,1-diphosphonic acid or 2-phosphonobutane-1,2,4-tricarboxylic acid.

[21] The rinsing and/or cleaning composition of [1], wherein the composition has a pH of about 3 to about 4.

[22] The rinsing and/or cleaning composition of [1], wherein the composition does not comprise polymer particles or a sulfate surfactant.

[23] The rinsing and/or cleaning composition of [1], wherein the concentration of the anionic surfactant is about a 10× concentration.

[24] A method of cleaning a surface having ceria particles, comprising contacting the surface with a composition of [1].

[25] The method of [24], wherein the surface having ceria particles was previously subjected to chemical mechanical polishing (CMP).

[26] The method of [24], wherein the contacting step is performed in a brush box.

[27] A method of rinsing a surface having ceria particles, comprising contacting the surface with a composition of [1].

[28] The method of [27], wherein the surface having ceria particles was previously subjected to chemical mechanical polishing (CMP).

[29] The method of [27], wherein the contacting step is performed on a platen after polishing or performed on a subsequent platen.

What is claimed is:

1. A composition comprising:
   an anionic surfactant represented by the following Formula (I):

$$C_mH_{2m+1}—(OCH_2CH_2)_n\text{-L-R} \quad \text{(I), wherein:}$$

$6 \leq m \leq 20$;
   $n \geq 5$;
   L represents an —O—, —S—, —$R^1$—, —S—$R^1$— or —O—$R^1$— bond (wherein $R^1$ represents $C_{1-4}$ alkylene); and
   R represents at least one selected from the group consisting of a carboxy group and a salt thereof;
   an organic amine compound; and
   a protic organic acid molecule,
   wherein the composition has a pH of less than 6.

2. The composition according to claim 1, wherein:
   the organic amine compound is at least one selected from the group consisting of 2-(diethylamino)ethanethiol, captamine, diethylethanolamine, methylcysteamine, 2-(tert-butylamino)ethanethiol, 2,2'-dimethoxy-1,1-dimethyl-dimethylamine, 3-amino-4-octanol, 3-butoxypropylamine, N-acetylcysteamine, homocysteamine, N,N-dimethylhydroxylamine, 2-(isopropylamino)ethanol, 2-(methylthioethyl)amine, 1-aminopropane-2-thiol, leucinol, cysteamine, and N,O-dimethylhydroxylamine; and
   the protic organic acid molecule is at least one selected from the group consisting of glyphosin, N-(phosphonomethyl)iminodiacetic acid hydrate, hydroxyphosphonoacetic acid, citric acid, hydroxyethane-1,1-diphosphonic acid, and 2-phosphonobutane-1,2,4-tricarboxylic acid.

3. The composition according to claim 1, wherein
   the organic amine compound has a sum of electronegativity gradients (SENG) of greater than −1.0,
   the protic organic acid molecule has at least one dissociated complexing functional group,
   and a density of binding modes (DBM) for the functional group(s) of the molecule is 0.013 or more.

4. The composition according to claim 1, wherein $5 \leq n \leq 12$ in the Formula (I).

5. The composition according to claim 1, wherein the anionic surfactant is at least one selected from the group consisting of capryleth-9 carboxylic acid or a salt thereof.

6. The composition according to claim 1, wherein the organic amine compound is at least one selected from the group consisting of 3-amino-4-octanol, cysteamine, N,N-dimethylhydroxylamine, and N,O-dimethylhydroxylamine.

7. The composition according to claim 1, wherein the protic organic acid molecule is at least one selected from the group consisting of hydroxyethane-1,1-diphosphonic acid and 2-phosphonobutane-1,2,4-tricarboxylic acid.

8. The composition according to claim 1, which is used for cleaning or rinsing a surface to which ceria particles are attached.

9. A surface treatment method for removing ceria particles from a surface to which the ceria particles are attached, the surface treatment method comprising a step of bringing the surface into contact with the composition according to claim 1.

* * * * *